United States Patent [19]

Franquet

[11] 3,795,871

[45] Mar. 5, 1974

[54] HIGH FREQUENCY PHASE SHIFT OSCILLATOR UTILIZING FREQUENCY DEPENDENT TRANSISTOR PHASE SHIFTS

[75] Inventor: Jacques Franquet, Noisy le Roi, France

[73] Assignee: Electronique Marcel Dassault, Paris, France

[22] Filed: June 6, 1972

[21] Appl. No.: 260,145

[30] Foreign Application Priority Data

June 9, 1971 France .............................. 7120881

[52] U.S. Cl. ................. 331/45, 331/46, 331/108 B, 331/135, 331/177 R

[51] Int. Cl. .......................... H03b 3/04, H03b 5/00

[58] Field of Search ..........331/45, 46, 108 R, 108 B, 331/111, 135, 136, 777 R

[56] References Cited

UNITED STATES PATENTS

| | | | |
|---|---|---|---|
| 3,641,369 | 2/1972 | Wallingford | 331/108 R X |
| 3,639,858 | 2/1972 | Miyata et al. | 331/108 R |

*Primary Examiner*—H. K. Saalbach

*Assistant Examiner*—Siegfried H. Grimm

*Attorney, Agent, or Firm*—Hane, Baxley & Spiecens

[57] ABSTRACT

The invention discloses a method and device for generating electrical oscillations in a closed loop circuit comprising an amplifier and a phase shifter, transistors being used as components of the amplifier and phase shifter which transistors are operated above their frequency $f\beta$.

6 Claims, 2 Drawing Figures

HIGH FREQUENCY PHASE SHIFT OSCILLATOR UTILIZING FREQUENCY DEPENDENT TRANSISTOR PHASE SHIFTS

The invention relates to a method for generating electrical oscillations and to a device for carrying out this method.

Adjustable frequency electronic oscillators are known which comprise, connected in a loop, an amplifier, at which level the high frequency energy is available and a phase inverter providing a phase shift opposite to that provided by the amplifier.

Until now, the phase inverter has been constituted by means of passive elements (inductor, capacitor) and usually the value of the capacitor is varied in order to vary the frequency of this type of oscillators.

On the one hand, with such oscillators, it is difficult to obtain very high frequencies.

On the other hand, they consume quite a considerable amount of energy owing to the way their frequency is controlled, and this consumption is all the greater the higher the frequencies to be obtained.

The present invention is based on the finding that the operation of a transistor, when the frequency exceeds a predetermined value, known as $f_\beta$, causes a phase shift between its intput and its output.

Whereas this feature of transistors was until now considered to be a drawback, it is used by the invention to constitute an adjustable frequency oscillator suitable for providing very high frequencies and which is easy and economical to manufacture.

According to the invention, a first transistor is used as a component of the amplifier and a second transistor, connected to the first in such a way as to constitute a loop circuit, is the component of the phase converter, the loop being under a voltage such that the sum of phase shifts obtained is exactly equal to $2\pi$.

In the following description, given for purposes of illustration, reference is made to the accompanying drawing, in which.

Figure 1:
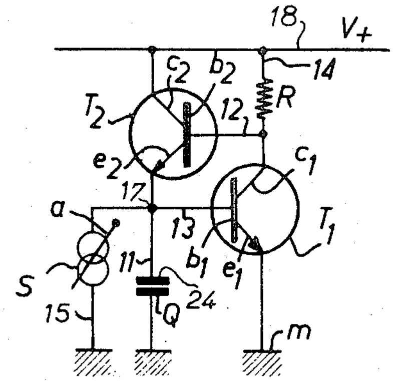
FIG. 1 is a diagram of a first embodiment.

Reference being first made to FIG. 1, the oscillator includes a first transistor $T_1$ the collector $c_1$ of which is connected, by means of a resistor R, to the positive pole V+ of a d.c. voltage source and the emitter $e_1$ of which is connected to the ground $m$. Collector $c_1$ of transistor $T_1$ is connected to the base $b_2$ of a second transistor $T_2$ the collector $c_2$ of which is connected to the positive pole V+ of the d.c. voltage source and the emitter $e_2$ is connected to the base $b_1$ of transistor $T_1$. Circuit 11 of which transistor $T_2$ is a part, includes between emitter $e_2$ and ground a capacitor Q. Capacitor Q transforms the high-frequency current passing therethrough from emitter $e_2$ to a high-frequency input voltage for the base $b_1$ of transistor $T_1$. A d.c. source of current S, the amplitude of which may be adjusted by an actuating element $a$, is parallel connected with capacitor Q between emitter $e_2$ and ground $m$.

In the loop constituted by transistor $T_1$, conductor 12, transistor $T_2$ and conductor 13, the feedback is negative for direct current and low frequency currents. Owing to the operational feature of transistors whereby a transistor causes a frequency dependent phase shift for frequencies exceeding a value usually designated as $f_\beta$, the operating conditions are modified for these frequencies : transistor $T_1$, connected as an amplifier, causes not only a $\pi(180°)$ phase shift but an $\epsilon 1$ phase shift for frequencies exceeding the frequency $f_\beta{}^1$ of transistor $T_1$. Transistor $T_2$, connected as a phase shifter, causes, besides phase shift $\pi/2$, a phase shift $\epsilon 2$, for frequencies greater than the frequency $f_\beta{}^2$ of said transistor so that, in the loop comprising the two transistors $T_1$ and $T_2$, the total phase shift is equal to:

$$\pi+\epsilon 1+(\pi/2)+\epsilon 2$$

There is a frequency F greater than $f_\beta{}^1$ and $f_\beta{}^2$ for which $\epsilon 1$ and $\epsilon 2$ assume values such that one obtains:

$$\pi+\epsilon 1+(\pi/2)+\epsilon 2=2\pi$$

For this frequency, the loop feedback is positive and the circuit functions as an oscillator.

At the oscillation frequency, one has:

$$\epsilon 1+\epsilon 2=\pi/2$$

The phase shift value introduced by transistor $T_2$ may be modified by varying the d.c. current supplied by the source S by actuating element $a$. The frequency of the oscillations provided by the device may thus be adjusted over a large range, of frequencies that are all, of course, higher than the highest of the frequencies $f_\beta$ of the transistors.

The device may be manufactured using an integrated circuit.

It functions at low power.

The wide variety of transistors available on the market makes it possible to design oscillators the working ranges of which cover different frequency ranges.

Figure 2:
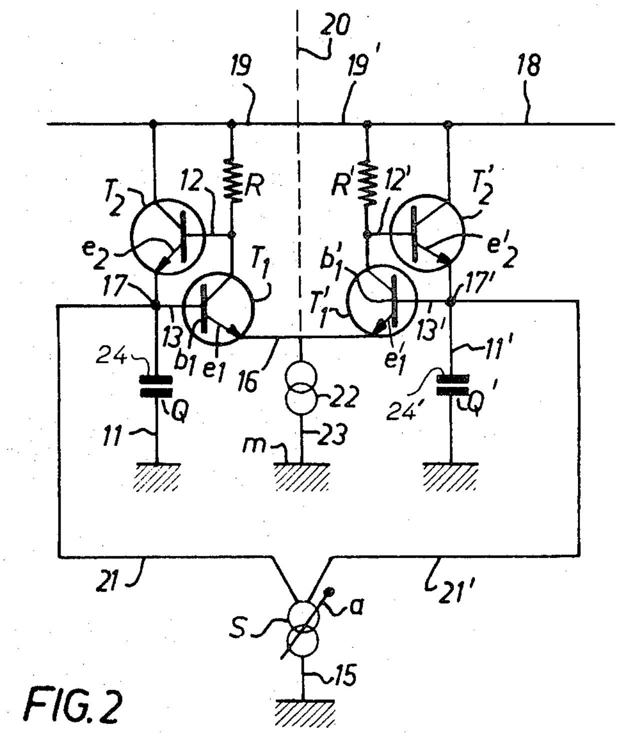
FIG. 2 is a diagram of a second embodiment.

With reference to FIG. 2 relating to another embodiment, a first unit constituted by the transistor $T_1$ and the transistor $T_2$ connected together as in the first embodiment and a second unit constituted by transistor $T'_1$ and $T'_2$ connected together as in the first embodiment, the two units being then symmetrically connected.

The adjustable d.c. current source S in circuit 15 is connected by two conductors 21 and 21' to points 17 and 17', common respectively to the emitter $e_2$ of transistor $T_2$, to the base $b_1$ of transistor $T_1$ and to the plate 24 of capacitor Q opposite the grounded plate and, on the other hand, to the emitter $e'_2$ of transistor $T'_2$, to the base $b'_1$ of transistor $T'_1$ and to the plate 24' of capacitor Q'.

A source of d.c. current 22 is present in line 23 connecting line 16, inserted between emitters $e_1$ and $e'_1$, to the ground.

The device functions in a way similar to that of the previous embodiment. Both oscillators oscillate at the same high-frequency, which is determined by the intensity of the d.c. current generated by the adjustable d.c. current source S, and the output high frequency voltage may be taken in parallel on either one of resistors R and R'. In this embodiment, however, there is no high frequency voltage in the d.c. voltage supply line 18, this being due to the symmetrical connection applying, to portions 19 and 19' of line 18, located on either side of the symmetry line 20, high frequency voltages of constantly opposite phases.

I claim:

1. A method for generating electrical oscillations, comprising the steps of connecting a first transistor operating as an amplifier at frequencies above the frequency $f_\beta$ above which the transistor exhibits a frequency dependent phase shift between its input and its output to a second transistor operating as a phase shifter at frequencies above the frequency $f_\beta$ above which it exhibits a frequency dependent phase shift between its input and its output, said connecting being such that the collector of one transistor is connected to the base of the other transistor, and the emitter of the other transistor is connected to the base of the one transistor and connecting a power supply across said transistors, whereby oscillations are generated at frequencies higher than frequency $f_\beta$.

2. An electrical oscillator comprising a first transistor mounted as an amplifier and operated at frequencies above its frequency $f_\beta$, a second transistor mounted as a phase shifter between the collector and base of said first transistor and operated at frequencies above its frequency $f_\beta$, a power supply, at least one resistor connected between the collector of said first transistor and a terminal of said power supply and at least one capacitor connected between the base of said first transistor and ground, whereby oscillations are generated at frequencies higher than the highest of said $f_\beta$ frequencies, the frequency $f_\beta$ of a transistor being the frequency above which the transistor exhibits a frequency dependent phase shift between its input and its output.

3. An electrical oscillator comprising: a resistor, a first transistor, means for connecting the emitter of said first transistor to ground, means for connecting the collector of said first transistor to a first terminal of said resistor, a second transistor of same conductivity type as said first transistor, means for connecting the emitter of said second transistor to the base of said first transistor, means for connecting the base of said second transistor to the collector of said first transistor, means for connecting the collector of said second transistor to the second terminal of said resistor, a d.c. current source connected between the emitter of said second transistor and the ground, a capacitor connected in parallel with said current source, and a d.c. voltage source connected between said second terminal of said resistor and the ground, the amplitudes of the current and voltages of said sources being chosen so that said transistors operate at frequencies greater than their frequency $f_\beta$ where the frequency $f_\beta$ of the transistor is the frequency at which the transistor operates with a frequency dependent phase shift between signals received at its input and signals transferred from its output.

4. An oscillator according to claim 3, wherein said current source is an adjustable current source adapted to vary the current through said second transistor, thereby causing the frequency of oscillation of said oscillator to vary.

5. A four-pole device as an element of a high-frequency phase-shift oscillator comprising: a first transistor, the emitter of which is a first pole of said four-pole device, a second transistor of the same conductivity type as said first transistor, means for connecting the emitter of said second transistor to the base of said first transistor, said connecting means being a second pole of said four-pole device, means for connecting the base of said second transistor to the collector of said first transistor, said connecting means being a third pole of said four-pole device, the collector of said second transistor being the fourth pole of said four-pole device and a capacitor connected between said first and second poles.

6. A device for generating high-frequency electrical oscillations comprising: first and second four-pole elements, each of said elements comprising a first transistor, the emitter of which is a first pole of said four-pole element, a second transistor of the same conductivity type as said first transistor, first connecting means for connecting the emitter of said second transistor to the base of said first transistor, said first connecting means being a second pole of said four-pole element, second connecting means for connecting the base of said second transistor to the collector of said first transistor, said second connecting means being a third pole of said four-pole device, and the collector of said second transistor being the fourth pole of said four-pole device, a first resistor connected between the third and the fourth poles of said first four-pole device, a first capacitor connected between the second pole of said first four-pole device and ground, a second resistor connected between the third and the fourth poles of said second four-pole device, a second capacitor connected between the second pole of said second four-pole device and ground, an adjustable first current source connected between ground and the second poles of said first and second four-pole devices, a second current source connected between ground and both first poles of said first and second four-pole devices, and a voltage source connected between ground and both fourth poles of said first and second four-pole devices, whereby the high frequency oscillations generated by said first and second four-pole devices are always of same frequency and are always of opposite phases in the electrical conductors connected to the poles of said voltage source, and whereby the output for high frequency oscillations may be taken across the two ends of either one of said first and second resistors.

* * * * *